(12) United States Patent
Inazuki et al.

(10) Patent No.: US 6,362,076 B1
(45) Date of Patent: Mar. 26, 2002

(54) METHOD OF FABRICATING AN SOI WAFER BY HYDROGEN ION DELAMINATION WITHOUT INDEPENDENT BONDING HEAT TREATMENT

(75) Inventors: Yukio Inazuki; Hiroji Aga; Norihiro Kobayashi; Kiyoshi Mitani, all of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/295,296

(22) Filed: Apr. 20, 1999

(30) Foreign Application Priority Data

Apr. 23, 1998 (JP) ............................................. 10-131350

(51) Int. Cl.[7] ...................... H01L 21/324; H01L 21/306
(52) U.S. Cl. ....................................................... 438/458
(58) Field of Search ................................. 438/459, 480, 438/455, 458, 478, 479

(56) References Cited

U.S. PATENT DOCUMENTS

| 5,744,401 A | | 4/1998 | Shirai et al. |
| 5,869,387 A | * | 2/1999 | Sato et al. |

FOREIGN PATENT DOCUMENTS

| EP | 0553852 A2 | 8/1993 | |
| EP | 0767486 A2 | 4/1997 | |
| EP | 0 867 928 A2 | * 9/1998 | |
| EP | 0867928 A2d | 9/1998 | |
| EP | 0917188 A2 | 5/1999 | |
| JP | 5-211128 | 8/1993 | .......... H01L/21/205 |
| JP | 07254689 A | 10/1995 | ........... H01L/27/12 |
| JP | 08264552 | 10/1996 | |

OTHER PUBLICATIONS

H. Moriceau et al., "Cleaning and Polishing as Key Steps for Smart–Cut SOI Process", Oct. 1996, Proceedings of the 1996 IEEE International SOI Conference, pp. 152–153.*
H. Bruel et al., "Smart Cut: A Promising New SOI Material Technology", Oct. 1995, Proceedings IEEE International SOI Conference, pp. 178–179.*
Sakaguchi, "Current Progress in Epitaxial Layer Transfer (ELTRAN)", Mar. 1997, IEICE Transactions on electronics, vol. 1, E80–C, No. 3, pp. 378–387.*
Sakaguchi K. et al., "Current progress in epitaxial layer transfer (ELTRAN)", IEICE Transactions on electronics, vol. 1, E80–C, No. 3, Mar. 1, 1997, pp. 378–387.
Aspar B et al., Basic mechanism involved in the Smart–Cut@R process, Microelectronic Engineering, vol. 36, Jun. 1, 1997, p. 233–240.

* cited by examiner

Primary Examiner—Charles Bowers
Assistant Examiner—Evan Pert
(74) Attorney, Agent, or Firm—Hogan & Hartson, L.L.P.

(57) ABSTRACT

There is disclosed a method of fabricating an SOI wafer by a hydrogen ion delamination method wherein a surface of an SOI layer is not polished but is subjected to heat treatment in a reducing atmosphere containing hydrogen after a bonding heat treatment, a method of fabricating an SOI wafer by a hydrogen ion delamination method wherein a surface of an SOI layer is not polished but subjected to heat treatment in a reducing atmosphere containing hydrogen after delaminating heat treatment, and a SOI wafer fabricated by the methods. There are provided a method of fabricating an SOI wafer by a hydrogen ion delamination method wherein a damage layer remaining on the surface of the SOI layer after delamination is removed and surface roughness is improved without polishing, so that uniform thickness of the SOI layer can be achieved, and to simplify the process therefor.

5 Claims, 4 Drawing Sheets

METHOD OF FABRICATING AN SOI WAFER BY HYDROGEN ION DELAMINATION WITHOUT INDEPENDENT BONDING HEAT TREATMENT

BACKGROUND OF THE INVENTION

1. Field of the Invention

The present invention relates to a method of removing a damage layer remaining on an SOI (silicon on insulator) layer after delamination, improving surface roughness, and simplifying the process in a so-called hydrogen ion delamination method (also called a smart-cut method) wherein an ion-implanted wafer is bonded to another wafer and a portion of the ion-implanted wafer is delaminated to provide an SOI wafer.

2. Description of the Related Art

Conventionally, two methods have gained wide notice as methods of fabricating wafers having an SOI structure. One method is a SIMOX (separation by implanted oxygen) method in which oxygen ions are implanted into a silicon monocrystal at a high concentration, and heat treatment is then performed at a high temperature in order to form an oxide layer. The other method is a bonding method in which two mirror-polished silicon wafers are bonded together without use of adhesive, and one of the wafers is subsequently made very thin.

In the SIMOX method, the thickness of an SOI layer that becomes a device active region can be determined and controlled through adjustment of an acceleration voltage at the time of oxygen ion implantation. Therefore, the SIMOX method has an advantage of enabling easy formation of a thin SOI layer having a high uniformity of thickness (hereinafter referred to as "thickness uniformity"). However, the SIMOX method has many problems in relation to the reliability of a buried oxide layer, the crystallinity of the SOI layer, and necessity of heat treatment at a temperature of 1300° C. or higher.

Meanwhile, in the wafer bonding method, an oxide film is formed on at least one of two mirror-polished silicon single crystal wafers, which are bonded together without use of adhesive and then subjected to heat treatment (typically, at 1100–1200° C.) in order to strengthen the bonding; subsequently, one of the wafers is subjected to grinding or wet etching such that the wafer becomes a thin film, the surface of which is then mirror-polished to form an SOI layer. Therefore, the reliability of the buried oxide layer is high, and the crystallinity of the SOI layer is good.

However, since the thin film is formed by means of mechanical machining, it takes long time to form the thin film. Furthermore, there are limits to the thickness and thickness uniformity of the resultant SOI wafer in formation of the thin film by grinding and polishing by means of mechanical machining.

Furthermore, a CZ wafer produced by Czochralski method (CZ method) is mostly used in the wafer bonding method. However, it has been found in recent years that there exist in the CZ wafer crystal defects called COP (Crystal Originated Particles) which are incorporated while the crystal is growing. Accordingly, when the CZ wafer is used as a bond wafer which is to be a device active layer, COP exists also in the SOI layer, and pierces through the SOI layer which is very thin as required recently to form a pin hole which extremely degrades electric characteristics of the wafer.

To solve the problem, there is proposed, for example, a method wherein a CZ wafer on which an epitaxial layer is grown is bonded to the other wafer on the side of the epitaxial layer, and the silicon wafer which constitutes a base is ground and polished to form a SOI layer (Japanese Patent Application Laid-open (Kokai) No.7-254689). According to the method, the above mentioned crystal defects such as COP can be surely eliminated. However, since it is necessary to perform grinding and polishing by means of mechanical machining in order to form the SOI layer, there still exists the problem in relation to limit to the thickness and thickness uniformity.

When an FZ wafer is used, there is no problem in relation to defects due to oxygen or the above mentioned COP, since almost no oxygen is contained in the FZ wafer. However, since it is necessary to perform grinding and polishing by means of mechanical machining in order to form the SOI layer, there still exists the problem in relation to limiting the thickness and thickness Uniformity such as described above.

In the wafer bonding method, not only silicon wafers are bonded together, but also a silicon wafer may be bonded directly to an insulator wafer of $SiO_2$, SiC, $Al_2O_3$ or the like, in order to form an SOI layer.

Recently, public attention has been drawn to a new method of fabricating an SOI wafer in which an ion-implanted wafer is bonded to another wafer and a portion of the ion-implanted wafer is delaminated (split) to thereby obtain an SOI wafer (hydrogen ion delamination method: so-called smart-cut method). In this method, an oxide film is formed on the surface of at least one of two silicon wafers; at least one of hydrogen ions and rare gas ions are implanted into the surface of one of the two silicon wafers in order to form a fine bubble layer (enclosed layer) within the wafer; the ion-implanted silicon wafer is superposed on the other silicon wafer such that the ion-implanted surface comes into close contact with the surface of the other silicon wafer via the oxide film; heat treatment (delamination heat treatment) is performed to delaminate a portion of the ion-implanted wafer while the fine bubble layer is used as a delaminating plane, in order to form a thin film; and heat treatment (bonding heat treatment) is further performed to firmly bond the thin film and the other wafer, to thereby obtain an SOI wafer (see Japanese Patent Application Laid-Open (kokai) No. 5-211128 or U.S. Pat. No. 5,374,564). Also, in this method, since the surface formed as a result of delamination (hereinafter referred to as a "delaminated surface") has a mirror-like surface, an SOI wafer whose SOI layer has a high thickness uniformity is obtained with relative ease.

Also in the hydrogen ion delamination method described above, not only silicon wafers are bonded together, but also a silicon wafer may be bonded directly to an insulator wafer of $SiO_2$, SiC, $Al_2O_3$, etc., in order to form an SOI layer.

When the SOI layer is formed according to the hydrogen ion delamination method described above, there exists a damage layer due to ion implantation on the surface of the SOI wafer after delamination, and surface roughness of the resultant SOI wafer is large. Accordingly, it is necessary to perform a mirror polishing process called touch polishing wherein a stock removal is very small in the final step after the bonding heat treatment in order to remove a damage layer and to improve surface roughness in the hydrogen ion delamination method.

When the SOI layer is polished by means of mechanical machining in the final step as described, thickness uniformity of the SOI layer achieved by delamination is deteriorated, since the stock removal is not uniform.

Moreover, necessity of mirror polishing after bonding heat treatment means too many and complicated processes disadvantageous in view of cost.

SUMMARY OF THE INVENTION

The present invention has been accomplished to solve the above-mentioned problems, and an object of the present invention is to provide a method of fabricating an SOI wafer by hydrogen ion delamination wherein a damage layer remaining on the surface of the SOI layer after delamination is removed and surface roughness is improved without polishing, so that uniform thickness of the SOI layer can be achieved, and to simplify the processes.

To achieve the above mentioned object, the present invention provides a method of fabricating an SOI wafer by hydrogen ion delamination wherein a surface of an SOI layer is not polished but subjected to heat treatment in a reducing atmosphere containing hydrogen after bonding heat treatment.

When the SOI layer is subjected to heat treatment in a reducing atmosphere containing hydrogen after bonding heat treatment as described above, a damage layer remaining on the surface of the SOI layer is removed, and surface roughness can be improved. Accordingly, mechanical polishing is not necessary, and thus thickness uniformity is not deteriorated. As a result, good thickness uniformity achieved by the hydrogen ion delamination method is maintained, and an SOI wafer having extremely excellent quality can be provided.

The present invention also provide a method of fabricating an SOI wafer by hydrogen ion delamination wherein a surface of an SOI layer is not polished but subjected to heat treatment in a reducing atmosphere containing hydrogen after a delaminating heat treatment.

When the SOI layer is subjected to heat treatment in a reducing atmosphere containing hydrogen after a delaminating heat treatment as described above, a damage layer remaining on the surface of the SOI layer is removed, and surface roughness can be improved. Moreover, the heat treatment in a reducing atmosphere containing hydrogen can also function as bonding heat treatment. Accordingly, mechanical polishing is not necessary, and thus thickness uniformity is not deteriorated. Furthermore, it is not necessary to perform bonding heat treatment independently, so that the SOI wafer having extremely high quality can be fabricated in more simple processes by the hydrogen ion delamination method.

In an embodiment of the present invention, the heat treatment in a reducing atmosphere containing hydrogen is performed at a temperature in the range from 1000° C. to a melting point of silicon for 6 hours or less.

When the heat treatment is performed under the condition mentioned above, a damage layer on the surface of the SOI layer after delamination can be surely removed, and the surface roughness can be improved. The heat treatment in a reducing atmosphere containing hydrogen can be performed through use of a conventional heat treatment furnace.

In another embodiment of the present invention, heat treatment in a reducing atmosphere containing hydrogen is performed at a temperature in the range from 1000° C. to a melting point of silicon for 1 to 300 seconds through use of a rapid heating/rapid cooling apparatus.

When the SOI wafer after delamination is subjected to the heat treatment in a reducing atmosphere containing hydrogen through use of the rapid heating/rapid cooling apparatus as mentioned above, removal of a damage layer on the surface of the SOI layer and improvement of surface roughness can be achieved efficiently in a very short time.

It is preferable that a CZ wafer is used as a bond wafer in the above-mentioned method, since COPs in the above-mentioned SOI layer can also be improved thereby.

In another embodiment of the present invention, heat treatment in a reducing atmosphere containing hydrogen is performed in 100% hydrogen atmosphere or a mixed atmosphere of hydrogen and argon.

In such an atmosphere for heat treatment, a damage layer on the surface of the SOI layer can be surely removed, and the surface roughness can be improved.

According to the method of the present invention, SOI wafer having good thickness uniformity and excellent quality can be provided.

Especially, there can be provided a high quality SOI wafer having a thickness uniformity of ±3 nm or less, a surface roughness of 0.3 nm or less as RMS value, and a surface defect density of the SOI layer of $10^3$ number/cm$^2$ or less.

As described above, according to the present invention, a damage layer remaining on the surface of the SOI layer after delamination is removed and surface roughness is improved without polishing but with a heat treatment in a reducing atmosphere containing hydrogen. Accordingly, SOI wafer having a good thickness uniformity can be fabricated, and processes can be simplified. As a result, an SOI wafer of extremely high quality can be produced at low cost.

DESCRIPTION OF THE INVENTION AND A PREFERRED EMBODIMENT

The present invention will be further described below in detail, referring figures, but is not limited thereto.

Figure 1:
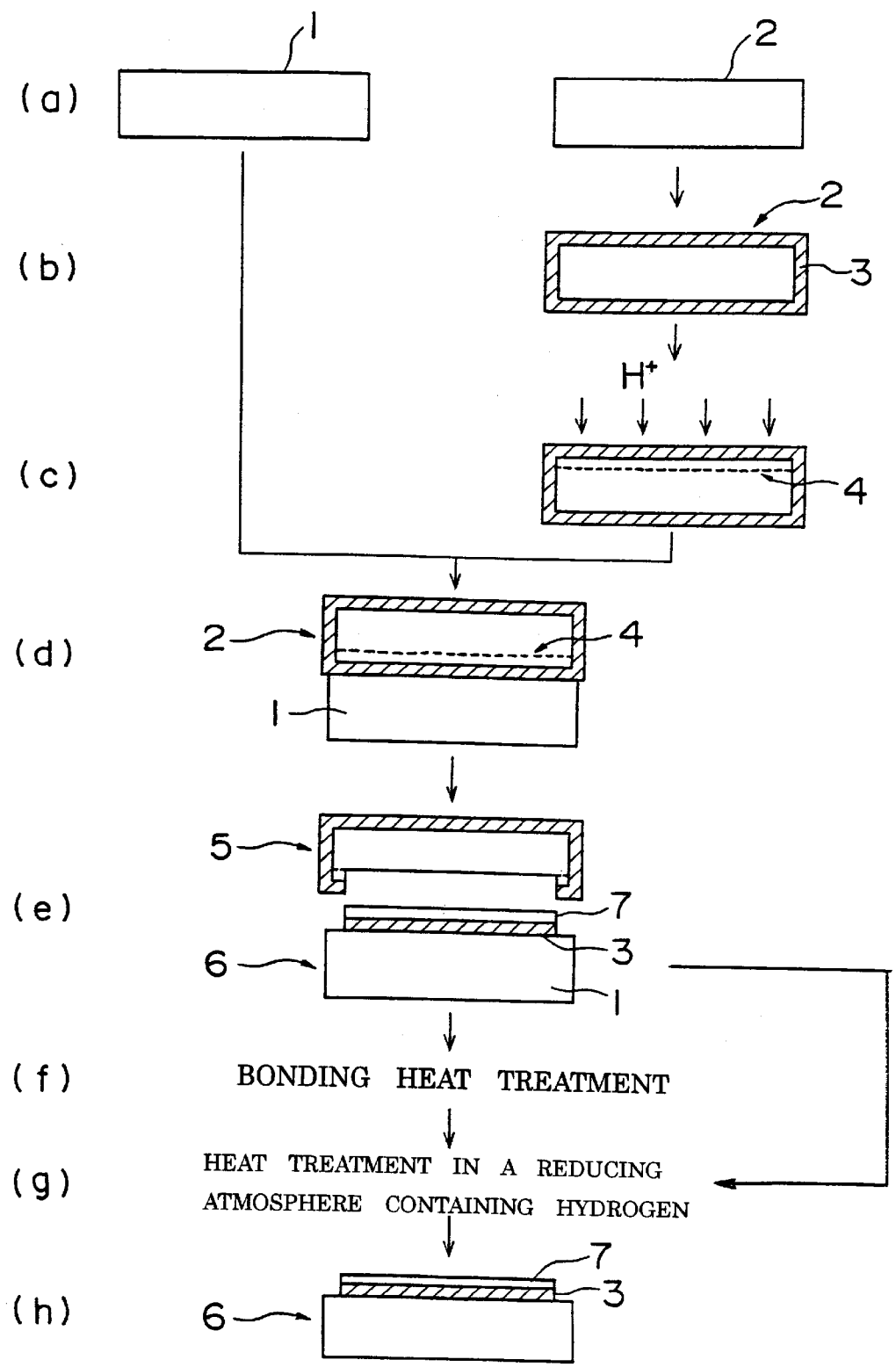
FIG. 1 steps (a) to (e) and (g) to (h) is a flowchart showing an example of an SOI-wafer fabricating process according to the hydrogen ion delamination method of the present invention.

FIG. 1 is a flowchart showing an example of an SOI-wafer fabricating process according to the hydrogen ion delamination method of the present invention.

The present invention will be hereunder explained mainly as a method of producing an SOI wafer by bonding two silicon wafers. In step (a) of the hydrogen ion delamination method shown in FIG. 1, two silicon mirror polished wafers, namely a base wafer 1 to be a base and a bond wafer 2 to be SOI layer which are suitable for device specifications are prepared.

In step (b), at least one of the wafers (the bond wafer 2 in this case) is subjected to thermal oxidation so as to form on the surface thereof an oxide film 3 having a thickness of about 0.1 µm to 2.0 µm.

In step (c), at least one of hydrogen ions and rare gas ions (hydrogen ions in this case) are implanted into one surface of the bond wafer 2 on which oxide film is formed, in order to form a fine bubble layer (enclosed layer) 4 which extends in parallel to the surface at a position corresponding to the mean depth of ion implantation. The implantation temperature is preferably 25–450° C.

In step (d), the base wafer 1 is superposed on the hydrogen ion-implanted surface of the hydrogen ion-implanted bond wafer 2 via the oxide film, and they are brought in close contact with each other. When the surfaces of the two wafers are brought into contact with each other at ambient temperature in a clean atmosphere, the wafers adhere to each other without use of adhesive or the like.

In step (e), there is performed a heat treatment for delamination (splitting) in which a delamination wafer 5 is delaminated from an SOI wafer 6 (composed of the SOI layer 7, a buried oxide layer 3, and a base wafer 1) while the enclosed layer 4 is used as a delaminating plane. The heat treatment is performed, for example, at a temperature of about 500° C. or higher in an inert gas atmosphere so as to cause crystal rearrangement and bubble cohesion, and thereby the delaminated wafer 5 is delaminated from the SOI wafer 6.

The above mentioned steps are the same as the steps of conventional hydrogen ion delamination method. The steps following thereto are performed in two ways according to the present invention as described below.

In one embodiment, a bonding heat treatment is performed in the step (f) after the delaminating step as performed in the conventional method. In this step, the SOI wafer 6 is subjected to heat treatment at high temperature as a bonding heat treatment to achieve sufficient bonding strength, since the bonding strength imparted in the closely contacting step (d) and the delaminating heat treatment step (e) described above is not sufficient to be used without further treatment in a device process. Preferably, this heat treatment is performed in an inert gas atmosphere at 1050–1200° C. for 30 minutes to 2 hours.

According to the conventional method, touch polishing is then performed to remove a damage layer on a delaminating surface which is a surface of the SOI layer 7 and improve the surface roughness. However, according to the present invention, heat treatment in a reducing atmosphere containing hydrogen is performed in step (g) instead, in order to remove the damage layer on the surface of the SOI layer and improve the surface roughness.

As described above, it is possible to remove the damage layer on the surface of the SOI layer and improve the surface roughness without deteriorating thickness uniformity by subjecting the SOI wafer to the heat treatment in a reducing atmosphere containing hydrogen without polishing the surface of the SOI layer after the bonding heat treatment.

In a second embodiment, after delamination process, heat treatment in a reducing atmosphere containing hydrogen in step (g) is performed without conducting an independent bonding heat treatment process (f), and without polishing the surface of the SOI layer.

Namely, the heat treatment in a reducing atmosphere containing hydrogen right after delamination heat treatment not only contributes to removal of the damage layer remaining on the surface of the SOI layer and improvement of the surface roughness, but also functions as a bonding heat treatment. Accordingly, it is not necessary to polish the surface mechanically, so that thickness uniformity is not deteriorated. Furthermore, it is not necessary to perform a bonding heat treatment independently, and therefore a simple process can be achieved. As a result, productivity of the SOI wafer having high quality can also be improved.

The SOI wafer 6 of high quality having the SOI layer 7 of high crystal quality and high thickness uniformity can be produced by the steps described above (step (h)).

The above mentioned heat treatment in a reducing atmosphere containing hydrogen in the step (g) can be conducted, for example, at 1000° C. to a melting point of silicon, preferably at 1200 to 1350° C. for 6 hours or less.

When the high temperature heat treatment is conducted for a long time under the above-mentioned condition, it is possible to surely remove the damage layer on the surface of the SOI wafer after delamination and to improve the surface roughness through use of any type of furnace. Although heat treatment at 1200° C. or more enables efficient removal of the damage layer and improvement of the surface roughness, heat treatment at a temperature higher than 1350° C. may cause problems in relation to durability of a furnace and wafer contamination. Accordingly, heat treatment at a temperature of 1200° C. to 1350° C. is preferable.

However, heat treatment using a general furnace such as described above takes long time. Accordingly, the heat treatment of the present invention can be conducted through use of a rapid heating/rapid cooling apparatus at a temperature in the range from 1000° C. to the melting point of silicon for 1 to 300 seconds.

When the delaminated SOI wafer is subjected to the heat treatment in a reducing atmosphere containing hydrogen through use of the rapid heating/rapid cooling apparatus as described above, the damage layer on the surface of SOI wafer can be removed and the surface roughness can be improved efficiently in a short time. Temperature in the range from 1200° C. to 1350° C. is more effective also in this case.

It is necessary to use the rapid heating/rapid cooling apparatus in the heat treatment in a reducing atmosphere containing hydrogen especially when a bond wafer is a CZ wafer by the following reason.

COPs incorporated during growth of crystal are present in the CZ wafer as described above, and the COP may pierce through the SOI layer which is very thin as required recently to form a pin hole. When the heat treatment in a reducing atmosphere containing hydrogen is conducted in such a circumstance for a long time, reducing gas passes through the pin hole to reduce buried oxide layer 3.

When the rapid heating/rapid cooling apparatus is used, the heat treatment time is very short. Accordingly, the above mentioned buried oxide layer is not reduced, and COPs in the SOI layer can also be removed together.

When the bond wafer is an epitaxial wafer or a FZ wafer, the buried oxide layer is not reduced. Accordingly, a general furnace can be used in the heat treatment in a reducing atmosphere containing hydrogen. However, the heat treatment using the rapid heating/rapid cooling apparatus is more efficient even in that case, since the heat treatment using a general furnace takes long time.

Examples of an apparatus which can heat and cool a SOI wafer rapidly in a reducing atmosphere containing hydrogen used in the present invention include: a heater such as a lamp heater with heat radiating. An example of commercially available apparatuses is SHS-2800 (product of AST corp.). These apparatuses are neither extremely complicated nor expensive.

Figure 4:
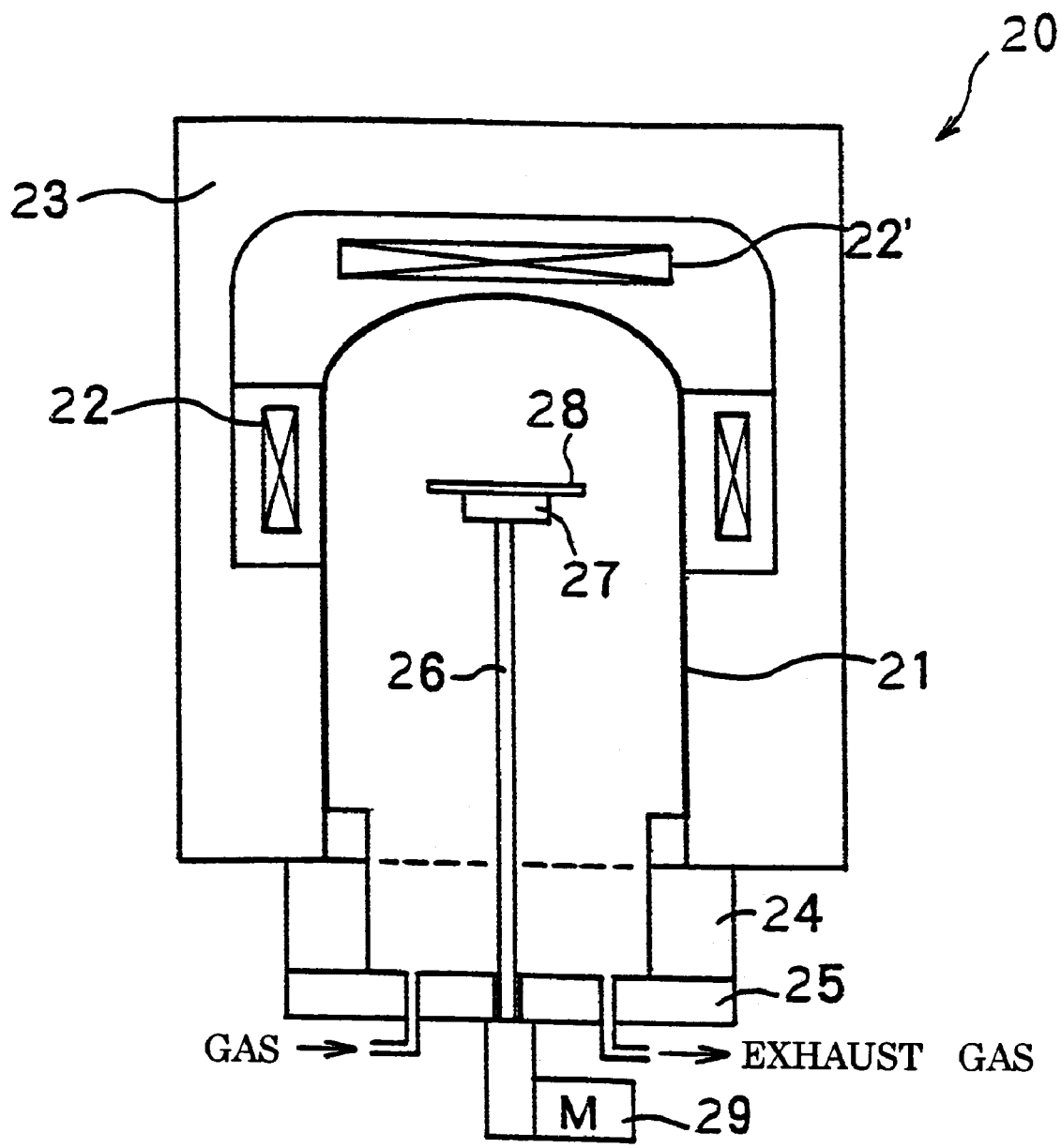
FIG. 4 is a schematic view of an example of a rapid heating/rapid cooling apparatus.

One example of the apparatus which can heat and cool a SOI wafer rapidly in a reducing atmosphere containing hydrogen used in the present invention will be given below. FIG. 4 is a schematic view of the rapid heating/rapid cooling apparatus.

A heat-treatment furnace 20 shown in FIG. 4 includes a bell jar 21 which is formed from, for example, silicon carbide or quartz and in which a wafer is heat-treated. Heating is performed with heaters 22 and 22' surrounding the bell jar 21. The heaters are separated into the upper one and the lower one, so that power supplied to each of the heaters can be controlled independently. The heating method is not limited thereto, but so-called radiation heating and induction heating may also be applicable. A housing 23 for heat shield is disposed around the heaters 22 and 22'.

A water-cooled chamber 24 and a base plate 25 are arranged at the lower portion of a furnace so as to isolate the interior of the bell jar 21 from the atmosphere. A SOI wafer 28 is held on a stage 27, which is attached to the top end of a support shaft 26, which, in turn, is moved vertically by means of a motor 29. In order to load a wafer into or unload from the furnace along a horizontal direction, the water-cooled chamber 24 has an unillustrated wafer port which is opened and closed by means of a gate valve. A gas inlet and a gas outlet are provided in the base plate 25 so that the gas atmosphere within the furnace can be adjusted.

In the heat treatment furnace 20 having the above-described structure, heat treatment in a reducing atmosphere containing hydrogen for rapid heating/rapid cooling of a SOI wafer is carried out in the procedure described below.

First, the interior of the bell jar 21 is heated to a desired temperature of 1000° C. to the melting point of silicon by the heaters 22 and 22' and is then held at the desired temperature. Through mutually independent control on power supplied to the heaters 22 and 22', a temperature distribution can be established within the bell jar 21 along a vertical direction. Accordingly, the heat-treatment temperature of a wafer is determined by the position of the stage 27, i.e. the amount of insertion of the support shaft 26 into the furnace. Heat treatment atmosphere is contolled by introducing a reducing gas containing hydrogen from the gas inlet provided in the base plate.

In a state in which the interior of the bell jar 21 is maintained at a desired temperature, a SOI wafer is inserted into the water-cooled chamber 24 through the wafer port by an unillustrated wafer handling apparatus arranged next to the heat treatment furnace 20. The inserted wafer is placed in, for example, a SiC boat provided on the stage 27 which is situated at the bottom standby position. Since the water-cooled chamber 24 and the base plate 25 are water-cooled, the wafer located at this standby position is not heated to a high temperature.

Upon completion of placing the SOI wafer on the stage 27, the motor 29 is immediately driven to insert the support shaft 26 into the furnace so that the stage 27 is raised to a heat treatment position where a desired temperature in the range of 1000° C. to a melting point of silicon is established, thereby heat-treating the SOI wafer at the high temperature. In this case, since only approximately 20 seconds, for example, is required for moving the stage 27 from the bottom standby position in the wafer-cooled chamber 24 to the heat treatment position, the SOI wafer is heated quickly.

The stage 27 is halted at the desired temperature position for a predetermined time (1 to 300 seconds), thereby subjecting the SOI wafer to high-temperature heat treatment over the halting time. Upon elapse of the predetermined time to complete high-temperature heat treatment, the motor 29 is immediately driven to withdraw the support shaft 26 from the interior of the furnace to thereby lower the stage 27 to the bottom standby position in the water-cooled chamber 24. This lowering motion can be completed in approximately 20 seconds, for example. The SOI wafer on the stage 27 is quickly cooled, since the water-cooled chamber 24 and the base plate 25 are water-cooled. Finally, the SOI wafer is unloaded from inside the water-cooled chamber 24 by the wafer handling apparatus, thus completing the heat treatment.

When there are more SOI wafers to be heat-treated, these wafers can be sequentially loaded into and heat-treated in the heat treatment furnace 20 maintained at a predetermined high temperature.

In this case, atmosphere of the heat treatment in reducing atmosphere containing hydrogen can be a 100% hydrogen atmosphere or a mixed atmosphere of hydrogen and argon.

In the above-mentioned atmosphere for the heat treatment, a film which is harmful for the surface of the SOI wafer is not formed, a damage layer on the surface of the SOI wafer can be surely removed, and the surface roughness can be improved.

As descried above, according to the present invention, SOI wafer having good thickness uniformity and very high quality can be obtained.

Particularly, the present invention can provide a SOI wafer which is excellent in any property, namely has thickness uniformity of SOI layer is ±3 nm or less, surface roughness of 0.3 nm or less (RMS value), and surface defect density of the SOI layer is $10^3$ number/cm$^2$ or less.

EXAMPLES

The following examples are being submitted to further explain the present invention. These examples are not intended to limit the scope of the present invention.

Example 1

Two mirror-polished silicon wafers having resistivity of 20 Ω·cm and a diameter of 150 mm wherein a conductive type is p type were prepared. These wafers were processed, while one of them was used as a bond wafer, through steps (a) to (h) shown in FIG. 1 according to the hydrogen ion delamination method of the present invention to fabricate SOI wafers.

First, the bond wafer was delaminated according to the steps (a) to (e) to provide an SOI wafer 6. Thickness of SOI layer was 0.4 μm. The major process conditions used in the method were as follows.

1) Thickness of a buried oxide layer: 400 nm (0.4 μm);
2) Conditions of hydrogen implantation: H$^+$ ions, implantation energy of 100 keV, implantation dose of 8×10$^{16}$/cm$^2$;
3) Conditions of heat treatment for delamination: in a N$_2$ gas atmosphere, at 500° C. for 30 minutes.

The SOI wafer having the SOI layer with thickness of 0.4 μm can be thus obtained. The surface roughness of the surface (delaminated surface) of the SOI wafer just delaminated as measured by atomic force microscope method at 1 μm square was 7.4 nm on the average (RMS value: root mean square roughness).

The value is 10 times or more that of the general mirror polished silicon wafer, and shows that local surface roughness on the surface of the SOI layer which is just delaminated is large.

Depth of a damage layer on the delaminated surface of the SOI wafer just delaminated in FIG. 1(e) was determined as follows. The SOI wafers were subjected to etching with KOH aqueous solution at a different etching removal. The SOI wafers were then subjected to a four step Secco etching method disclosed in H. Gassel et al. (J. Electrochem. Soc., 140, pp 1713, 1993), and observed with a microscope to count a density of pits existing on the surface. The etching removal was 0, 50, 100, 150, 200, 250, 300 nm. The results of measurement was shown as a curved line a in FIG. 2.

Figure 2:
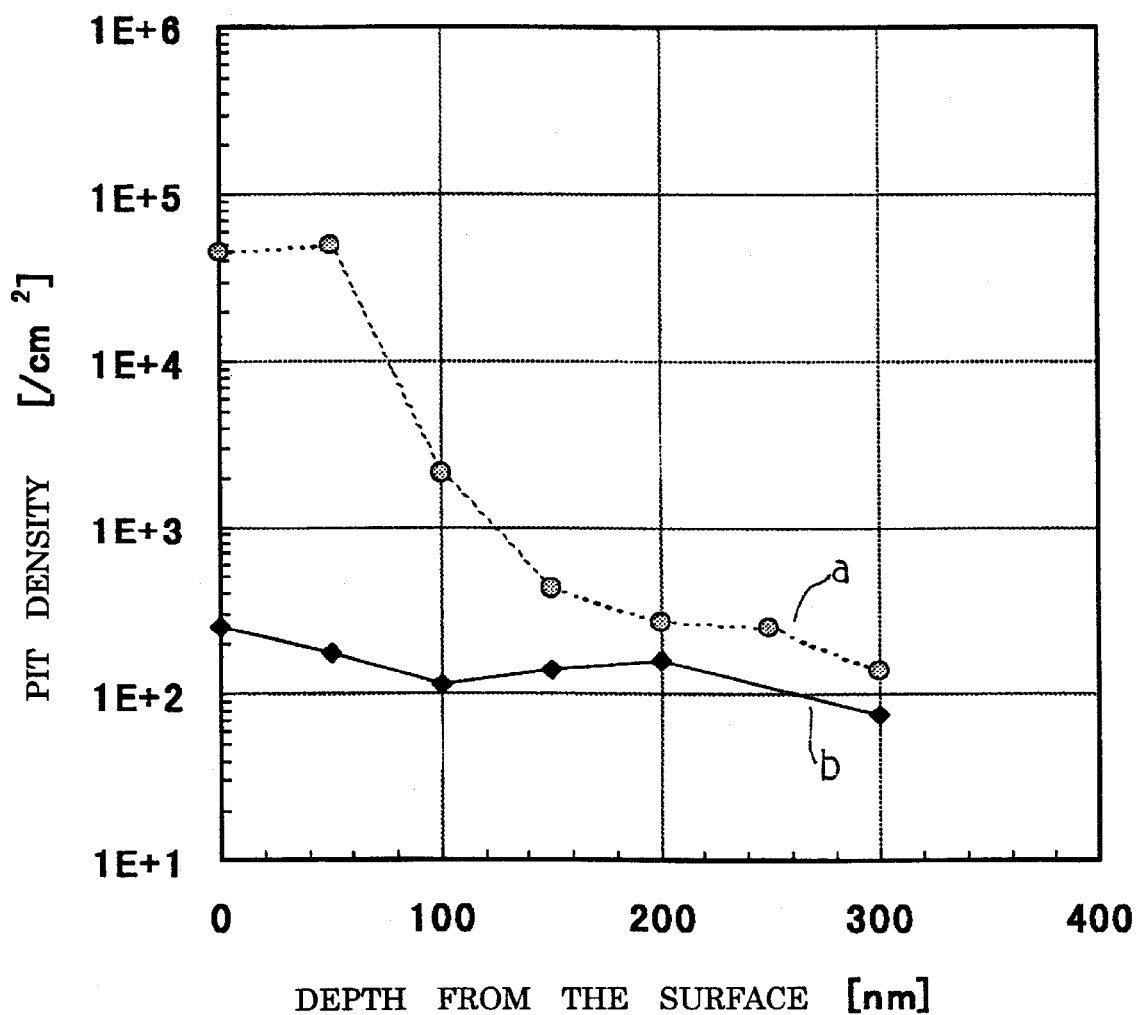
FIG. 2 is a graph showing a result of measurement of a damage layer of SOI wafer after delamination.

As shown in FIG. 2, it is apparent that a damage layer having a depth of about 150 nm exists on the surface of the SOI wafer which is just delaminated. Pits observed in a position deeper than 150 nm are likely crystal defects which have been originally present in the bond wafer.

Thickness of the SOI layer of the SOI wafer just delaminated in the step (e) was measured to determine the thickness uniformity. Thickness was measured by reflective spectroscopy at several thousands points in one mm pitch on the surface area other than area within 10 mm from periphery of the SOI wafer. A standard deviation (sigma) of the data was 0.9 nm, thickness uniformity (3 sigma) was ±2.7 nm or less, and ±3 nm or less at the largest. Accordingly, thickness uniformity of the SOI layer after delamination was quite excellent.

Next, as shown in step (f) of FIG. 1, the SOI wafer was subjected to bonding heat treatment under the following condition: in $N_2$ atmosphere, at 1100° C., for 2 hours to bond the SOI layer and the base wafer firmly.

Then, as shown in step (g), SOI wafer after bonding heat treatment was subjected to the heat treatment in a reducing atmosphere containing hydrogen through use of a rapid heating/rapid cooling apparatus shown in FIG. 4 without being polished under the following condition: in hydrogen 100% atmosphere, at 1200° C., for 30 seconds.

Before the heat treatment, the SOI wafer was subjected to cleaning to prevent contamination thereof. The cleaning is well known as RCA cleaning, and comprises two steps: (ammonia/hydrogen peroxide) and (hydrochloric acid/hydrogen peroxide).

The surface roughness of the SOI layer after the heat treatment with a rapid heating/rapid cooling apparatus was 0.25 nm in average (RMS value: root mean square roughness) as measured by atomic force microscope method at 1 μm square. Accordingly, the surface roughness of 0.3 nm or less can be surely achieved.

The value is equivalent to the value of the general mirror polished silicon wafer. Accordingly, it is apparent that the surface roughness was significantly improved by the heat treatment in a reducing atmosphere containing hydrogen.

Depth of the damage layer of the SOI wafer after heat treatment with a rapid heating/rapid cooling apparatus was determined as follows. The SOI wafers were subjected to etching with KOH aqueous solution at a different etching removal. The SOI wafers were subjected to the four step Secco etching method disclosed in H. Gassel et al., as described above, and observed with a microscope to count a density of pits existing on the surface. The etching removal was 0, 50, 100, 150, 200, 300 nm. The results of measurement was shown as a curved line b in FIG. 2.

As shown in FIG. 2, It is apparent that the damage layer was eliminated from the surface of the SOI wafer after subjected to the heat treatment in a reducing atmosphere containing hydrogen, though it was not polished. Namely, the surface defect density in the SOI layer was about 250 number/cm$^2$, which is constant in depth. Accordingly, the value of 10$^3$ number/cm$^2$ or less can be surely achieved.

Thickness of the SOI layer of the SOI wafer after heat treatment in a reducing atmosphere containing hydrogen was measured by reflective spectroscopy as described above to determine the thickness uniformity. Sigma of the data was 0.9 nm, and therefore, thickness uniformity (3 sigma) was ±2.7 nm, which is the same value as that before the heat treatment in a reducing atmosphere containing hydrogen. Accordingly, it is apparent that the thickness uniformity of the SOI layer of the SOI wafer fabricated by the present invention was ±3 nm or less, which is quite an excellent value.

Example 2

The SOI wafer 6 was produced by delaminating the bond wafer in accordance with the steps (a) to (e) of FIG. 1 in the similar way to that of Example 1. Thickness of the SOI layer was 0.4 μm. Main conditions such as ion implantation is also the same as Example 1.

The SOI wafer having the SOI layer with thickness of 0.4 μm can be thus obtained. The surface roughness of the surface (delaminated surface) of the SOI wafer just delaminated in FIG. 1(e) as measured by atomic force microscope method at 1 μm square was 8.4 nm on the average (RMS value: root mean square roughness).

Depth of a damage layer on the delaminated surface of the SOI wafer just delaminated in step (e) of FIG. 1 was determined as follows. The SOI wafers were subjected to etching with KOH aqueous solution at a different etching removal. The SOI wafers were then subjected to the four step Secco etching method disclosed in H. Gassel et al., as described above, and observed with a microscope to count a density of pits existing on the surface. Depth of a damage layer was about 150 nm which is the same as the value of Example 1.

Thickness of the SOI layer of the SOI wafer just delaminated in the step (e) was measured to determine the thickness uniformity. Thickness was measured by reflective spectroscopy at several thousands points in one mm pitch on the surface area other than area within 10 mm from periphery of the SOI wafer. Sigma of the data was 0.9 nm which is the same as the value of Example 1, thickness uniformity (3 sigma) was ±2.7 nm or less, and ±3 nm or less at the largest. Accordingly, thickness uniformity of the SOI layer after delamination was quite excellent.

Bonding heat treatment shown in step (f) of FIG. 1 was omitted. However, the SOI wafer just delaminated was subjected to the heat treatment which also functioned as bonding heat treatment in a reducing atmosphere containing hydrogen through use of a rapid heating/rapid cooling apparatus shown in FIG. 4 under the following condition: in hydrogen 100% atmosphere, at 1200° C., for 30 seconds.

Before the heat treatment, the SOI wafer was subjected to cleaning to prevent contamination thereof. The cleaning is well known as RCA cleaning, and comprises two steps: (ammonia/hydrogen peroxide) and (hydrochloric acid/hydrogen peroxide).

The surface roughness of the SOI layer after the heat treatment with a rapid heating/rapid cooling apparatus was 0.26 nm in average (RMS value: root mean square roughness) as measured by atomic force microscope method at 1 μm square.

The value is equivalent to the value of the general mirror polished silicon wafer. Accordingly, it is apparent that the surface roughness was significantly improved by the heat treatment in a reducing atmosphere containing hydrogen, whether bonding heat treatment is performed or not.

Depth of a damage layer of the SOI wafer after the heat treatment with a rapid heating/rapid cooling apparatus was determined as follows. The SOI wafers were subjected to etching with KOH aqueous solution at a different etching removal. The SOI wafers were subjected to the four step Secco etching method disclosed in H. Gassel et al., as described above, and observed with a microscope to count a density of pits existing on the surface. The etching removal was 0, 50, 100, 150, 200, 300 nm. It was shown that the damage layer was eliminated from the surface of the SOI wafer, though it was not polished.

Thickness of the SOI layer of the SOI wafer after heat treatment in a reducing atmosphere containing hydrogen was measured by reflective spectroscopy as described above to determine the thickness uniformity. Sigma of the data was 0.9 nm, and therefore, thickness uniformity (3 sigma) was ±2.7 nm, which is the same value as that before the heat treatment in a reducing atmosphere containing hydrogen. Accordingly, it is apparent that the thickness uniformity of the SOI layer of the SOI wafer fabricated by the present invention was ±3 nm or less, which is quite an excellent value.

In the SOI wafer of Example 2, since there was not independently conducted the bonding heat treatment which is generally performed in $N_2$ atmosphere at 1100° C. for 2 hours, it might be considered that bonding strength of the SOI layer would not be sufficient. However, SOI layer was not delaminated but a jig was ruptured in the tensile test wherein each of two jigs was adhered to the surface of the SOI layer and the surface of the base wafer respectively with adhesive and the jigs were pulled from the both side. Breaking strength of the jig was at least 800 $kg/cm^2$. Accordingly, the resultant bonding strength of the SOI layer is sufficient, when the SOI wafer is subjected to the heat treatment in a reducing atmosphere containing hydrogen with a rapid heating/rapid cooling apparatus.

Comparative Example

In the similar manner to Example 1, there was provided a SOI wafer by performing the hydrogen ion delamination method wherein bonding heat treatment was performed after delamination according to steps (a) to (f) in FIG. 1. Then, it was subjected to touch polishing as a conventional method to remove a damage layer on the surface and to improve the surface roughness.

Thickness of the SOI layer was measured by reflective spectroscopy. The result was shown in FIG. 3 in connection with a stock removal in touch polishing and the data of thickness (sigma, standard deviation).

Figure 3:
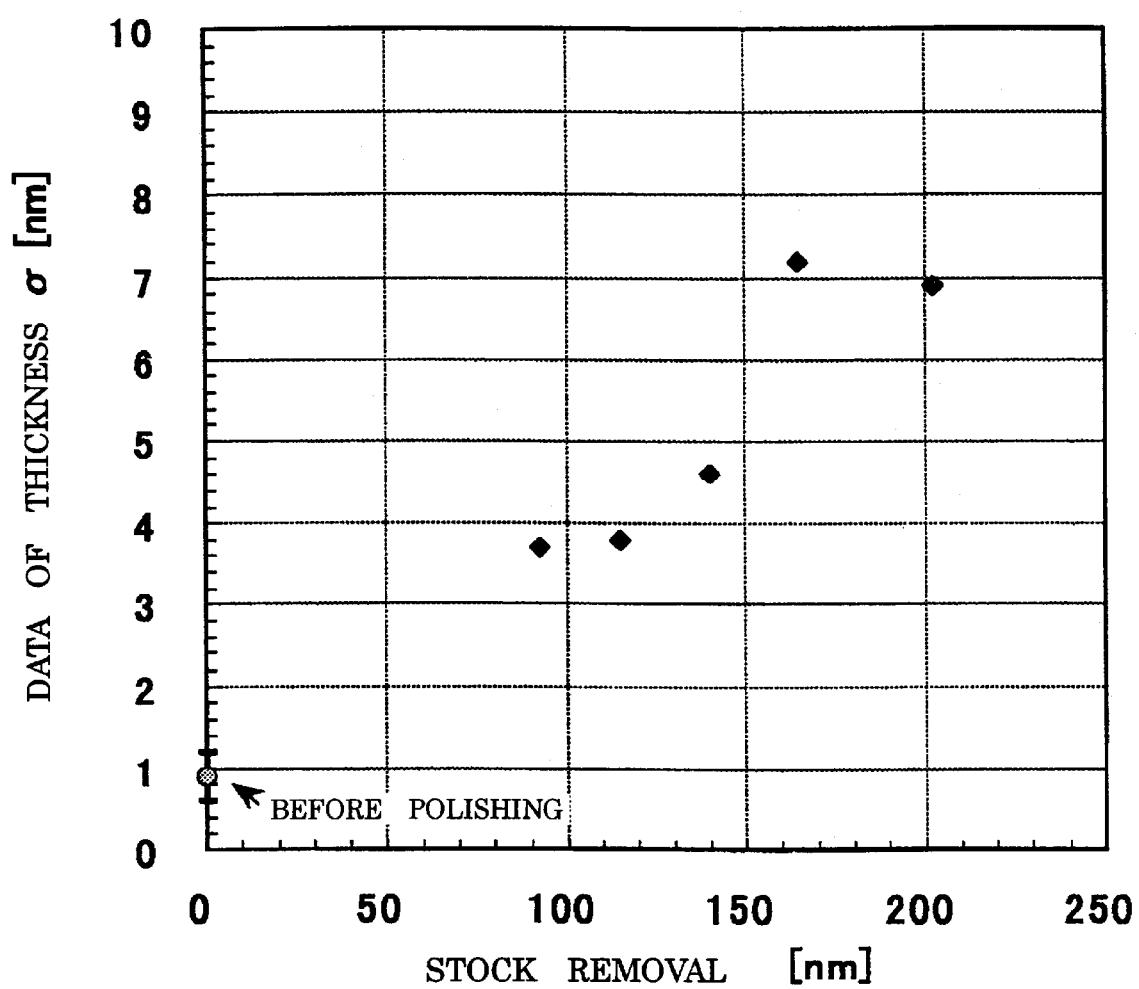
FIG. 3 is a graph showing a relation between stock removal and sigma of thickness of SOI layer.

As shown in FIG. 3, thickness uniformity was extremely deteriorated by polishing. Particularly, when polishing was conducted to the stock removal of 150 nm which is necessary in order to remove the damage layer on the surface, thickness uniformity was severely deteriorated.

The present invention is not limited to the above-described embodiment. The above-described embodiment is a mere example, and those having the substantially same structure as that described in the appended claims and providing the similar action and effects are included in the scope of the present invention.

For example, the above description of the present invention has focused on the case where two silicon wafers are bonded to obtain an SOI wafer. However, the present invention is not limited to the embodiment. For example, the present invention is applicable to the case where a silicon wafer is bonded to an insulator wafer after ion implantation; and a portion of the ion-implanted silicon wafer is delaminated to thereby obtain an SOI wafer.

Furthermore, the process of fabricating the SOI wafer according to the present invention is not limited to that shown in FIG. 1. Other processes such as cleaning, heat treatment or the like can be added thereto. Furthermore, the order of the processes can be partly changed or omitted depending on the purpose.

What is claimed is:

1. A method of fabricating an SOI wafer by a hydrogen ion delamination method wherein after a delaminating heat treatment, a heat treatment in a reducing atmosphere containing hydrogen is performed without conducting an independent bonding heat treatment, and without polishing a surface of an SOI layer.

2. The method of fabricating an SOI wafer according to claim 1 wherein said heat treatment in a reducing atmosphere containing hydrogen is performed at a temperature in the range from 1000° C. to a melting point of silicon for 6 hours or less.

3. The method of fabricating an SOI wafer according to claim 1 wherein said heat treatment in a reducing atmosphere containing hydrogen is performed at a temperature in the range from 1000° C. to a melting point of silicon for 1 to 300 seconds through use of a rapid heating/rapid cooling apparatus.

4. The method of fabricating an SOI wafer according to claim 3 wherein a CZ wafer is used as a bond wafer.

5. The method of fabricating an SOI wafer according to claim 1 wherein said heat treatment in a reducing atmosphere containing hydrogen is performed in a 100% hydrogen atmosphere or a mixed atmosphere of hydrogen argon.

* * * * *